(12) United States Patent
Warren

(10) Patent No.: US 6,381,721 B1
(45) Date of Patent: Apr. 30, 2002

(54) DETECTING COMMUNICATION ERRORS ACROSS A CHIP BOUNDARY

(75) Inventor: Robert Warren, Bristol (GB)

(73) Assignee: STMicroelectronics Limited, Almondsbury (GB)

( * ) Notice: Subject to any disclaimer, the term of this patent is extended or adjusted under 35 U.S.C. 154(b) by 0 days.

(21) Appl. No.: 09/311,990

(22) Filed: May 14, 1999

(30) Foreign Application Priority Data

May 15, 1998 (GB) .............................................. 9810512

(51) Int. Cl.[7] .............................................. G01R 31/28
(52) U.S. Cl. ...................................................... 714/727
(58) Field of Search ........................................ 714/727

(56) References Cited

U.S. PATENT DOCUMENTS

| | | | |
|---|---|---|---|
| 4,692,918 A | * 9/1987 | Elliott et al. ................. | 370/401 |
| 4,975,828 A | * 12/1990 | Wishneusky et al. ......... | 710/11 |
| 5,029,166 A | * 7/1991 | Jarwala et al. .............. | 714/724 |
| 5,056,094 A | * 10/1991 | Whetsel ...................... | 714/736 |
| 5,068,851 A | * 11/1991 | Bruckert et al. .............. | 714/25 |
| 5,649,001 A | 7/1997 | Thomas et al. .......... | 379/93.07 |
| 5,659,552 A | * 8/1997 | Ke et al. ..................... | 714/727 |
| 5,680,407 A | * 10/1997 | De Jong ...................... | 714/727 |
| 5,691,998 A | * 11/1997 | Sheets ........................ | 714/811 |
| 5,805,609 A | * 9/1998 | Mote, Jr. ..................... | 714/726 |
| 5,841,867 A | * 11/1998 | Jacobson et al. ........... | 713/187 |
| 6,032,268 A | * 2/2000 | Swoboda et al. ............. | 714/30 |
| 6,088,822 A | * 7/2000 | Warren ....................... | 714/726 |

FOREIGN PATENT DOCUMENTS

| | | | |
|---|---|---|---|
| EP | 0 698 890 A1 | 2/1996 | ........... G11C/29/00 |
| EP | 0 702 239 A2 | 3/1996 | ....... G01R/31/3173 |
| EP | 0 702 240 A2 | 3/1996 | ....... G01R/31/3173 |
| EP | 0 702 241 A2 | 3/1996 | ....... G01R/31/3173 |
| EP | 0 702 242 A2 | 3/1996 | ....... G01R/31/3173 |
| EP | 0 702 243 A2 | 3/1996 | ....... G01R/31/3185 |
| EP | 0 702 273 A2 | 3/1996 | .......... G03G/15/00 |
| EP | 0 709 688 A1 | 5/1996 | ....... G01R/31/3185 |
| EP | 0 729 249 A2 | 8/1996 | |
| EP | 0 840 217 A1 | 5/1998 | |
| EP | 0 840 218 A1 | 5/1998 | ........... G06F/11/00 |

OTHER PUBLICATIONS

"Stop Bit Detection for the 8031 Microcontroller" *IBM Technical Disclosure Bulletin,* vol. 29, No. 1, Jun. 1986, pp. 457–459.

J.S. Marcus et al., "Designing An Ethernet Interface Architecture For The System/370" *Proceedings Of Compcon 82 Fall,* Sep. 20–23, 1982, pp. 29–36.

"IEEE standard for Module Test and Maintenance Bus (MTM–Bus) protocol", Test Technology Standards Committee of the IEEE Computer Society, USA, IEEE Std 1149.5–1995, Jan. 24, 1996.*

* cited by examiner

*Primary Examiner*—Albert Decady
*Assistant Examiner*—Joseph P. Jones
(74) *Attorney, Agent, or Firm*—Lisa K. Jorgenson; E. Russell Tarleton; Seed IP Law Group, PLLC

(57) ABSTRACT

An integrated circuit provides for a connection port having a serial data input pin and a serial data output pin, on-chip functional circuitry and test logic, and a test access port controller connected to effect communication of serial data across the chip boundary via said input and output pins. The test access port controller is connectable to the test logic in a first mode of operation to effect communication of serial test data under control of an incoming clock signal and is operable in a second mode of operation to communication data as a sequence of serial bits according to a predetermined protocol between the connection port and the on-chip functional circuitry. The integrated circuit includes an error detection circuit for detecting an error condition in the protocol and gating circuitry responsive to detection of the error condition to prevent communication of subsequent data until the error condition is detected as having been removed.

18 Claims, 6 Drawing Sheets

DETECTING COMMUNICATION ERRORS ACROSS A CHIP BOUNDARY

TECHNICAL FIELD

This invention relates to the detection of communication errors across a chip boundary, particularly in the context of effecting communication of serial data across the chip boundary.

BACKGROUND TO THE INVENTION

European Patent Application Publication No. 0840217, hereby incorporated by reference, describes an integrated circuit which uses a test access port controller (TAP controller) for effecting communication of serial data across the chip boundary. The TAP controller has two modes of operation. In a first mode of operation, test data is supplied to the chip via an input pin and resultant data following the test is supplied off chip via an output pin of the TAP controller. This operates according to the IEEE Standard 1149.1-1990, hereby incorporated by reference. In a second mode of operation, the TAP controller is used for the communication of a serial sequence of bits including data bits and flow control bits which represent data generated by functional circuitry on the chip, for example a processor.

To this end, the integrated circuit has a connection port comprising a serial data input pin and a serial data output pin. That connection port can be used to connect the integrated circuit to a cable, the remote end of which is connectable to an interface having circuitry for receiving the sequence of serial bits and for converting them into data for transmission to an off chip processing system connected to the interface. The interface also includes means for converting data received from the off chip processing system into a serial format suitable for transmission via the cable and connection port to the integrated circuit.

In a situation where the off chip processing system has an independent power supply to the integrated circuit, it is quite possible that power can become disconnected from the integrated circuit while the interface and off chip processing system remain "powered up". In this scenario it is important that communication between the integrated circuit and the interface is prevented to prevent garbage data being transmitted and received.

Another fault that can arise is that the cable becomes physically disconnected from the connection port of the integrated circuit. In that context also it is important to prevent functional circuitry on the integrated circuit from attempting to transmit data off chip or attempting to analyze data received on-chip.

The present invention obviates or at least mitigates these disadvantages.

SUMMARY OF THE INVENTION

According to one aspect of the present invention there is provided an integrated circuit including a connection port having a serial data input pin and a serial data output pin, on-chip functional circuitry and test logic, and a test access port controller connected to effect communication of serial data across the chip boundary via said input and output pins. The test access port controller is connected to the test logic in a first mode of operation to effect communication of serial test data under control of an incoming clock signal, and operable in a second mode of operation to communication data as a sequence of serial bits according to a predetermined protocol between the connection port and the on-chip functional circuitry.

The integrated circuit includes error detection circuitry for detecting an error condition in the protocol and gating circuitry responsive to detection of the error condition to prevent communication of subsequent data until the error condition is detected as having been removed.

The integrated circuit can also include a data adaptor which is connectable to the input and output pins via the test access port controller in the second mode of operation, wherein in the second mode the data adaptor is supplied with parallel data and control signals from said on-chip functional circuitry and converts said parallel data and control signals into the sequence of serial bits including flow control bits and data bits for communicating off chip via the test access port controller under the control of the incoming clock signal. The data adaptor receives from off chip via the serial data input pin a sequence of serial bits including flow control bits and data bits for conversion into parallel data and control signals for said on-chip functional circuitry.

In a preferred embodiment, according to said predetermined protocol a stop bit is transmitted after each predetermined number of serial data bits, the error condition being detected by detecting lack of said stop bit.

Preferably, an error signal is asserted by the error detection circuitry on detection of the error condition. That error signal can be used to generate a visible indication to a user than an error condition has been detected.

The integrated circuit can additionally comprise circuitry for detection of removal of the error condition. This can be used to re-establish communication of serial data.

In one embodiment, the connection port includes a pull-up resistor which generates a logical value having a predetermined state indicating an error condition when a physical connection is broken at the connection port.

Embodiments of the invention also provide a communication system including an integrated circuit as herein defined above wherein the connection port is connected to a cable in the normal state, and an interface device having an interface port connected to a remote end of the cable and operable to receive and transmit data between the interface and the integrated circuit according to said predetermined protocol, said interface being operable to convert said data into a format suitable for communication to a network via an Ethernet connection.

The data adaptor in a preferred embodiment has first and second ports for receiving and transmitting respectively parallel data and control signals between the data adaptor and the functional circuitry.

The data adaptor preferably includes circuitry for generating flow control information from the flow control bits and the data to be transferred between the functional circuitry and the data adaptor. The flow control information can be one of the following types:

1) forward flow control information generated from flow control bits in the incoming sequence of serial bits and output by at least one pin of the first port;
2) forward data control information which is generated by the on-chip functional circuitry in association with the parallel data signal supplied to the first port;
3) reverse data control information which is generated from data bits in the sequence of serial bits received by the data adaptor; and
4) reverse flow control information which is generated by the on-chip functional circuitry in response to parallel data received thereby.

The forward flow control information can additionally be generated in dependence on the status of a storage circuit in the data adaptor which temporarily holds data and control signals pending their conversion into serial bits.

In the described embodiment, the parallel data signals received and transmitted by the data adaptor are eight bits wide.

The integrated circuits can include various source/destination logic on-chip. In one embodiment, the integrated circuit includes an on-chip bus system to which is connected a message converter which converts requests received from the bus system into parallel data for supply to the data adaptor, and converts parallel data received from the data adaptor into requests for supply via the bus system. The on-chip functional circuitry can comprise at least one processor connected to the bus system. The bus system can include at least one memory bus effecting communications with on-chip or off-chip memory connected or connectable to that memory bus.

BRIEF DESCRIPTION OF THE DRAWINGS

For a better understanding of the present invention and to show how the same may be carried into effect, reference will now be made by way of example to the accompanying drawings.

DESCRIPTION OF THE PREFERRED EMBODIMENT

Figure 1:
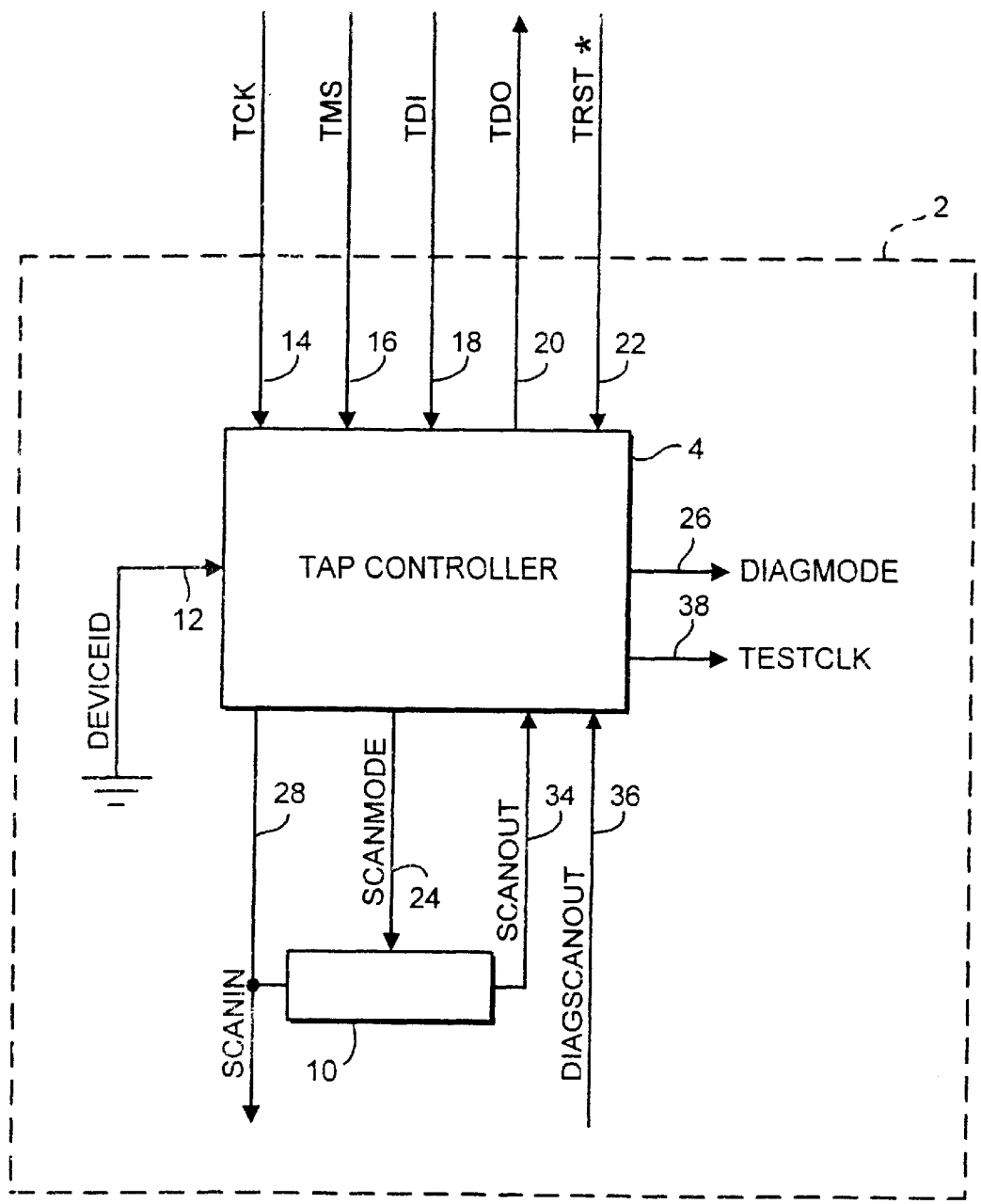
FIG. 1 illustrates an integrated circuit with a test access port controller having connections according to the described embodiment.

FIG. 1 illustrates schematically an integrated circuit 2 including a test access port (TAP) controller 4, and a chip boundary scan chain 10. The TAP controller 4 receives from off-chip a test clock signal TCK on line 14, a test mode select signal TMS on line 16, a test data input signal TDI on line 18, and a test reset input TRST* on line 22. The TAP controller 4 outputs off-chip a test data output signal TDO on line 20. The TAP controller 4 also receives a device identifier signal DEVICEID on line 12. In FIG. 1, the signal DEVICEID is shown as a signal line 12 connected, within the integrated circuit, to ground. The signal line 12 could be a multi-bit wire, and the signal DEVICEID could originate from either on the integrated circuit or off-chip. If the line 12 is a multi-bit wire, then each bit may be connected either to a logic low level or a logic high level on chip. The TAP controller 4 outputs to on-chip circuitry a scan data input signal SCANIN on line 28, a test clock signal TESTCLK on line 38, a signal indicating selection of a scan test mode SCANMODE on line 24, and a signal indicating selection of a diagnostic mode DIAGMODE on line 26. The chip boundary scan chain 10 receives as inputs the scan data input signal SCANIN on line 28 and the signal SCANMODE on line 24, and outputs a scan data output SCANOUT on line 34 to the TAP controller 4. The signal SCANIN on line 28 also is connected to on-chip source/destination logic for diagnostic purposes according to embodiments of the present invention and will be described hereafter. The source/destination logic provides an input signal DIAGSCANOUT to the TAP controller 4 on line 36 according to the embodiments of present invention.

Figure 5:
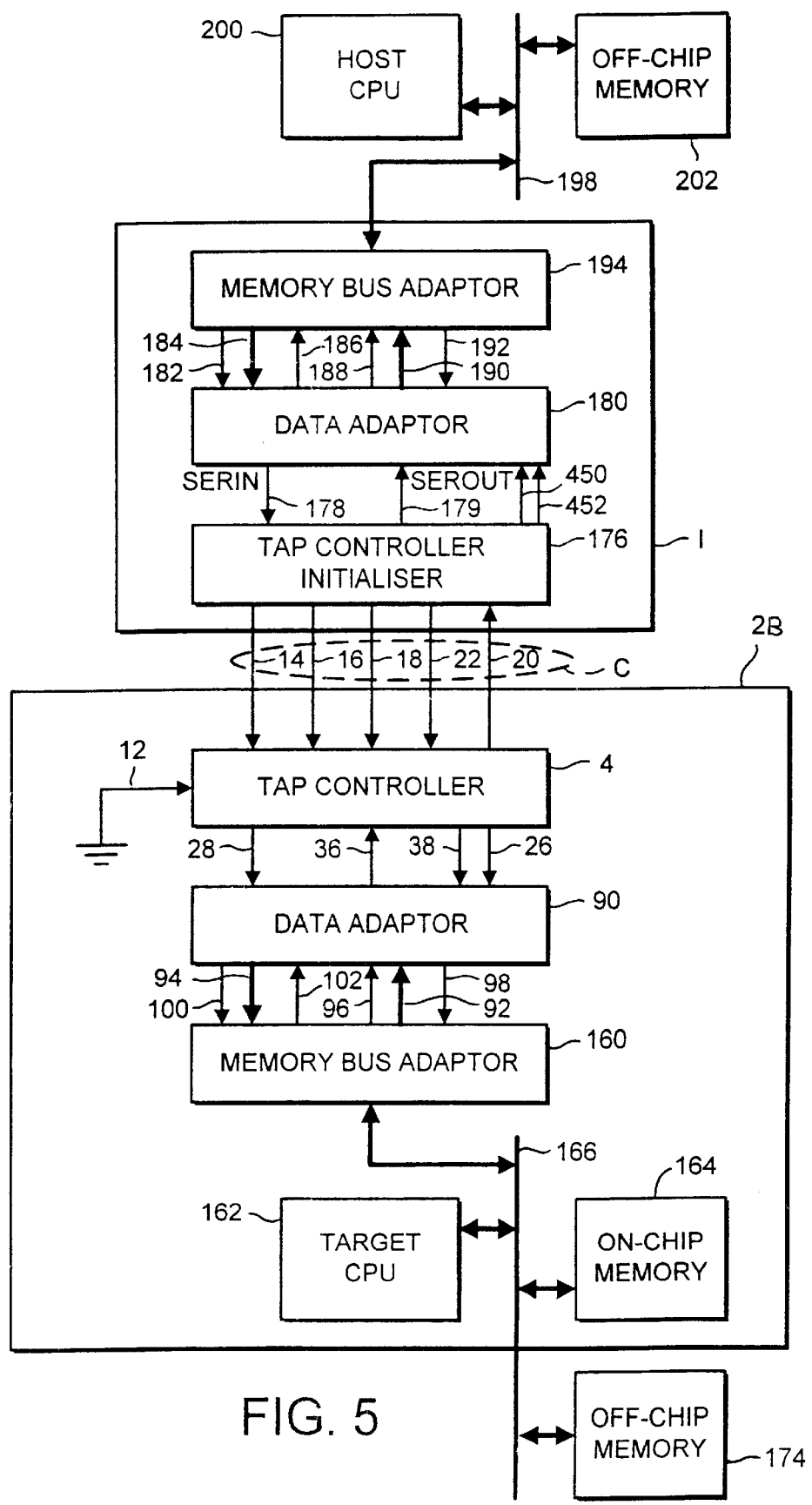
FIG. 5 illustrates in block diagram hierarchical form an implementation of the data adaptor of FIG. 3.
Figure 6:
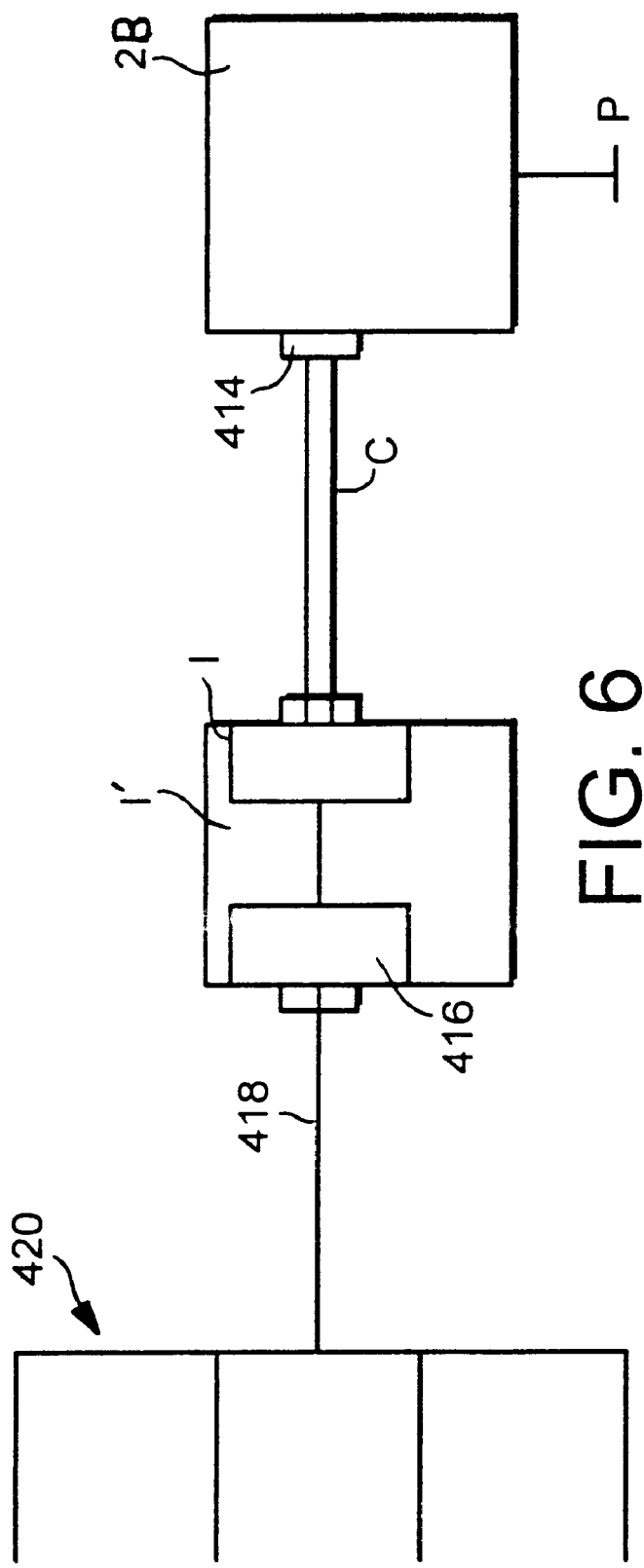
FIG. 6 illustrates a schematic of another context for the data adaptor.

FIG. 5, described in detail hereinbelow, illustrates the components that may constitute the source/destination logic according to one embodiment. The source/destination may at least be a processor connected to an on-chip bus system having on-chip memory connected thereto. Off-chip memory may also be connected directly to such a bus system. The on-chip destination/source logic may also include other functional circuitry with a DMA engine or EMI interface. As illustrated in FIG. 6 and described in more detail later another possibility is an Ethernet connection to a network.

Figure 2:
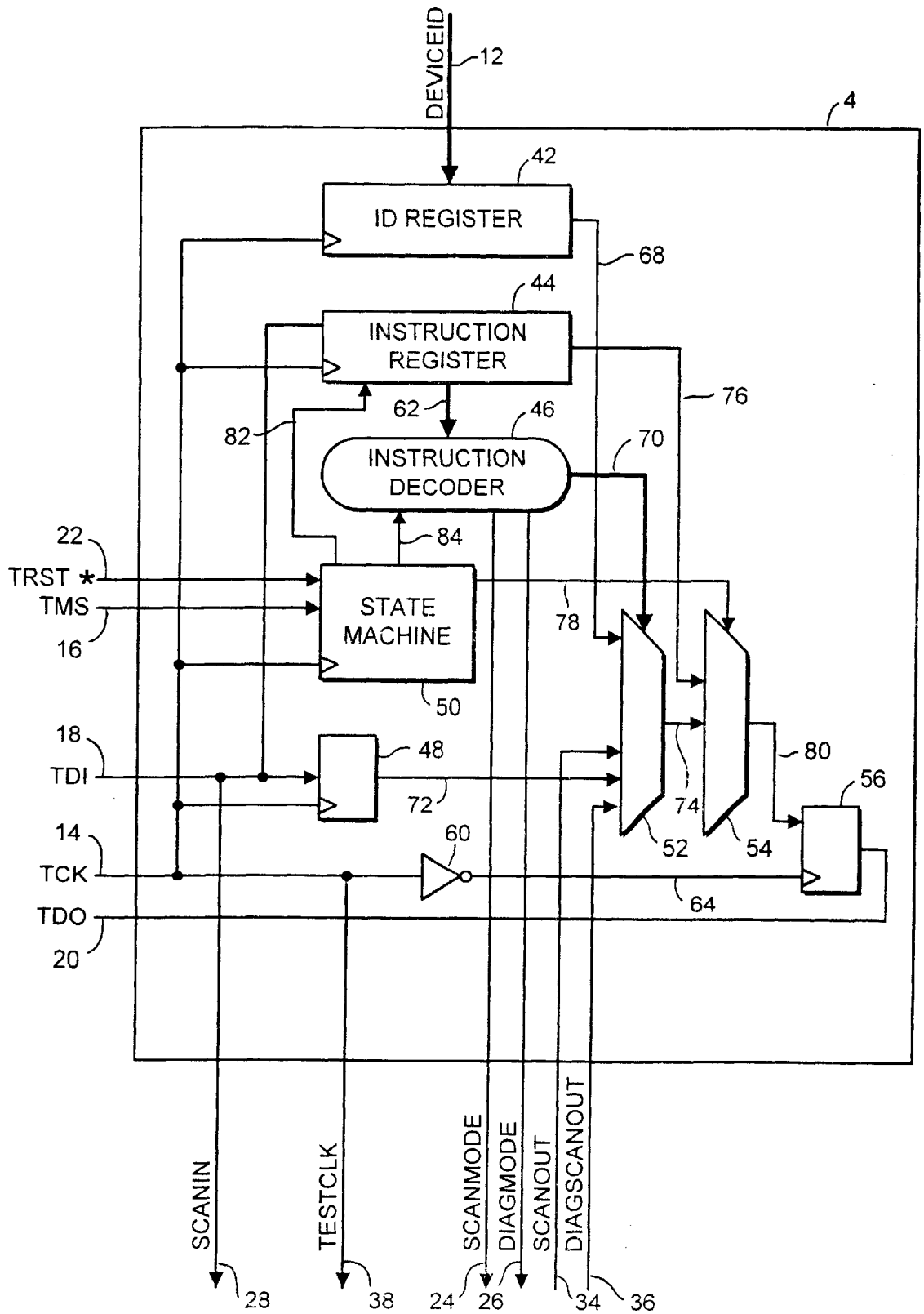
FIG. 2 illustrates the test access port controller of FIG. 1.

The TAP controller 4 is illustrated schematically in FIG. 2 with those circuit blocks useful to its standard operation by embodiments of the present invention. Referring to FIG. 2, the TAP controller 4, in basic form, comprises a state machine 50, an ID register 42, an instruction register 44, an instruction decoder 46, a bypass latch 48, a data multiplexor 52, an instruction/data multiplexor 54, a latch 56, and an inverter 60. The instruction register receives the test data input signal TDI on line 18, generates a parallel instruction on bus 62 and a serial output on line 76, and receives an instruction control input on line 82. The instruction decoder 46 receives the parallel instruction on bus 62 and a decoder control input on line 84, and generates the signals SCANMODE and DIAGMODE on lines 24 and 26 respectively, and a parallel data multiplexor select signal on line 70. The bypass latch 48 receives the test data input signal TDI on line 18 and generates an output on line 72. The ID register 42 receives the parallel signal DEVICEID on line 12 and generates a serial device identifier output on line 68. The data multiplexor 52 receives the output of the ID register 42 on line 68, the output of the bypass latch 48 on line 72, the SCANOUT signal on line 34, the DIAGSCANOUT signal on line 36 and the data multiplexor select signal on line 70. The data multiplexor 52 generates an output on line 74. The instruction/data multiplexor 54 receives the serial output on line 76, the output of the data multiplexor on line 74, and an instruction/data multiplexor select signal on line 78. The instruction/data multiplexor generates an output on line 80. The latch 56 receives the output of the instruction/data multiplexor 54 on line 80 and generates the test data output signal TDO on line 20. The state machine 50 receives the signal TMS on line 16, and the signal TRST* on line 22. The state machine generates the instruction/data multiplexor select signal on line 78, the instruction control input on line 82, and the decoder control input on line 84. The ID register 42, the instruction register 44, the instruction decoder 46, the bypass latch 48, the state machine 50, and the data converter 57 each receive the test clock signal TCK on line 14. The latch 56 receives the test clock signal TCK inverted via inverter 60 on line 64. The test clock signal TCK and the test data input signal TDI are connected directly as outputs TESTCLK on line 38 and SCANIN on line 28 respectively.

The operation of the TAP controller 4 in performing tests of the integrated circuit 2 is fully explained in IEEE 1149.1-1990. In essence finite length scan chains are formed on the integrated circuit such as that formed by chip boundary scan chain 10.

The TAP controller 4 is a synchronous finite state machine defined by IEEE Standard 1149.1-1990. IEEE Standard 1149.1-1990 defines test logic which can be included in an integrated circuit to provide standardized approaches to testing the interconnections between integrated circuits, testing the integrated circuit itself, and observing or modifying circuit activity during the integrated circuit's normal operation.

During normal operation of the integrated circuit 2, the TAP controller 2 is in a reset state, and all its inputs and outputs are inactive. When a test using the test access port according to IEEE Standard 1149.1-1990 is to be performed, the test access port controller operates according to the definitions of that standard. In such a test mode the test access port controller must be able to select at least one test mode of operation. One possible test mode is a scan test mode, which would be selected by setting the signal SCANMODE on line 24. In the scan test mode a scan chain on the integrated circuit 2 is selected for testing. In this example the chip boundary scan chain 10 is selected by the signal SCANMODE. Such a scan test may simply involve inputting data in at one end of the scan chain, and checking to see that the same data is output at the other end of the scan chain. Alternatively more complex scan operations may be performed, such as scanning in data which is input to functional logic on-chip, functionally clocking the chip for one or more clock cycles, and then scanning out the outputs of the functional logic. Any connection points or circuitry on-chip may be connected for test purposes to form a scan chain. The chip boundary scan chain 10 may be a series of flip-flops which are controlled in test mode to connect all the input/output ports of the integrated circuit 2. A full appreciation of such scan testing can be gathered from reference to IEEE Standard 1149.1-1990. For specific examples of how scan testing may be performed, reference should be made to European Patent Application Publication Nos. 0698890, 0702239, 0702240, 0702241, 0702242, 0702243, 0709688, all of which are hereby incorporated by reference.

A characteristic of known test modes using the test access port of IEEE Standard 1149.1-1990 is that the scan chain is of finite length or closed loop, and that the test data output signal TDO is dependent on the test data input signal TDI, and has a time relationship therewith.

In the described embodiment, the diagnostic mode of operation is provided for carrying out diagnostic procedures of source/destination logic on-chip, which is compatible with IEEE Standard 1149.1-1990. In such a diagnostic test mode, the test data output signal TDO is not dependent on the test data input signal and does not have a time relationship therewith. The chain between the test data input signal TDI and the test data output signal TDO is considered to be of infinite length, or open loop. In the diagnostic mode the TAP controller, whilst continuing to provide all normal functionality, additionally acts as a transport agent carrying full duplex, flow-controlled, unbounded, serial data, although the TAP controller is unaware that this is the form of the data. Conversely the TAP controller normally handles a single stream of data, without any flow control, passing through a selected scan chain.

An overview of the operation of the TAP controller 4 in a test mode will now be given with reference to FIGS. 1 and 2. It should be pointed out that although in FIG. 2 it is shown that the signal SCANIN is connected directly to the test data input signal TDI. In certain circumstances SCANIN may be a modified version of TDI. Similarly although the test clock signal TESTCLK is connected directly to the test clock signal TCK, the signal TESTCLK may in certain circumstances be required to be a modified version of the signal TCK.

In a test mode of operation, the test data input signal TDI and the test mode select signal TMS are supplied in serial fashion to the TAP controller 4 under control of the test clock signal TCK. The state machine 50 acts upon the value of the test mode select signal TMS on each active edge of the test clock signal TCK to cycle through its states accordingly as defined by IEEE Standard 1149.1-1990. The test reset signal TRST* provides for asynchronous initialization of the TAP controller 4 when in a low logic state in accordance with IEEE Standard 1149.1-1990.

The instruction register 44 is clocked by the test clock signal TCK to load an instruction in serial fashion from the test data input signal TDI under the control of the instruction control input signal on line 82 from the state machine 50. When the instruction has been serially loaded into the instruction register 44, it is transferred in parallel on instruction bus 62 to the instruction decoder 46 under control of the decoder control input signal on line 84 from the state machine 50. In accordance with the instruction stored therein, the instruction decoder will set one of either the SCANMODE signal or the DIAGMODE signal in accordance with whether it is a scan test or a diagnostic test which is to be performed. The loading of the instruction register 44 and the instruction decoder 46 are controlled by the state machine 50 in accordance with IEEE Standard 1149.1-1990. In accordance with the instruction decoded by the instruction decoder 46, and as described further hereinafter, the parallel output on line 70 of the instruction decoder 46 controls the data multiplexor 52 to connect one of its inputs to the output line 74. Similarly the output on line 78 of the state machine 50 controls the instruction/data multiplexor to connect one of its inputs to the output on line 80.

The ID register 42 receives the DEVICEID signal in parallel on lines 12. The ID register 42 stores a chip identifier which can be scanned out of the ID register 42 via line 68 to the test data output signal TDO. The chip identifier identifies the integrated circuit 2.

In one mode of operation the instruction decoded by the instruction decoder 46 may be simply to output the identity of the device, in which case the multiplexor 52 is controlled to connect its input on line 68 to its output on line 74, and the instruction/data multiplexor 54 is controlled to connect its input on line 74 to its output on line 80. The identity of the device is then serially output as the signal TDO.

In another mode of operation it may be required to output the current instruction on the test data output signal TDO, in which event the serial output on line 76 is connected by the instruction/data multiplexor 54 to the line 80.

In one mode of test operation, it may be required that the TAP controller 4 of a particular integrated circuit 2 merely connect the test data input signal TDI to the test data output signal TDO. In this mode of operation the data multiplexor is controlled to connect the output of the bypass flip-flop on line 72 to the output on line 74, and the instruction/data multiplexor is controlled to connect the line 74 to the output line 80. Thus the test data input signal TDI is connected to the test data output signal TDO via the flip-flop 56.

The latch 56 is merely a flip-flop provided only to allow timing control of the test data output signal TDO so that such signal can be synchronized to the negative edge of the test clock signal TCK.

If the test mode to be carried out is a scan test mode, then the instruction decoder 46 sets the signal SCANMODE. The data multiplexor 52 is controlled by the instruction decoder 46 to connect the signal SCANOUT to the output line 74. The instruction/data multiplexor 54 is also controlled to connect the line 74 to the line 80 so as to output the signal SCANOUT as the test data output signal TDO. During such a scan test mode test data is scanned into the selected scan chain on the SCANIN signal which is connected directly to the test data input signal TDI. Scan testing, in particular boundary scan testing, is fully described in IEEE Standard 1149.1-1990. It will be appreciated that additional control signals, in accordance with the test to be performed, need to be supplied to the selected scan chain to achieve the required test operation.

In the described embodiment a diagnostic mode may also be entered, in which case the instruction decoder 46 sets the signal DIAGMODE on the output line 26. Furthermore, the data multiplexor 52 will be controlled to connect the signal DIAGSCANOUT on line 36 to the output on line 74, which in turn is connected to the line 80 through the instruction/data multiplexor 54 and to the test data output signal TDO via the flip-flop 56.

In diagnostic mode, the serial data flow between the test data input signal TDI and the test data output signal TDO may be considered to pass through a shift register of infinite length as opposed to the scan test mode, in which mode the serial data flow is through a shift register (shift register chain) of finite length. In the diagnostic mode, a sequence of bit patterns shifted into the test access port as the test data input signal TDI are never reflected in the sequence of bit patterns shifted out of the test access port as the test data output signal. The communication of diagnostic data may include, for example, memory access requests from host to target and target to host (reads and writes); status information of CPU registers; data read from host memory or target memory in response to a memory access request; status data for loading into CPU registers; and information about memory addresses being accessed by the target CPU. Thus the diagnostic mode may involve non-intrusive monitoring of data, or intrusive loading of data.

In the diagnostic mode the serial data shifted into the test access port is a uni-directional serial data stream which can be encoded in any desired means, for example, with start and stop bits to delineate data chunks. Likewise, data shifted out via the test access port is a uni-directional serial data stream which can be encoded in any desired means, for example with start and stop bits to delineate data chunks. Normally the data shifted in and the data shifted out will be encoded in the same way. The input and output unidirectional data streams may be used simultaneously to allow full-duplex, bidirectional, serial communications. The sequence of serial data bits could constitute a byte of information.

Figure 3:
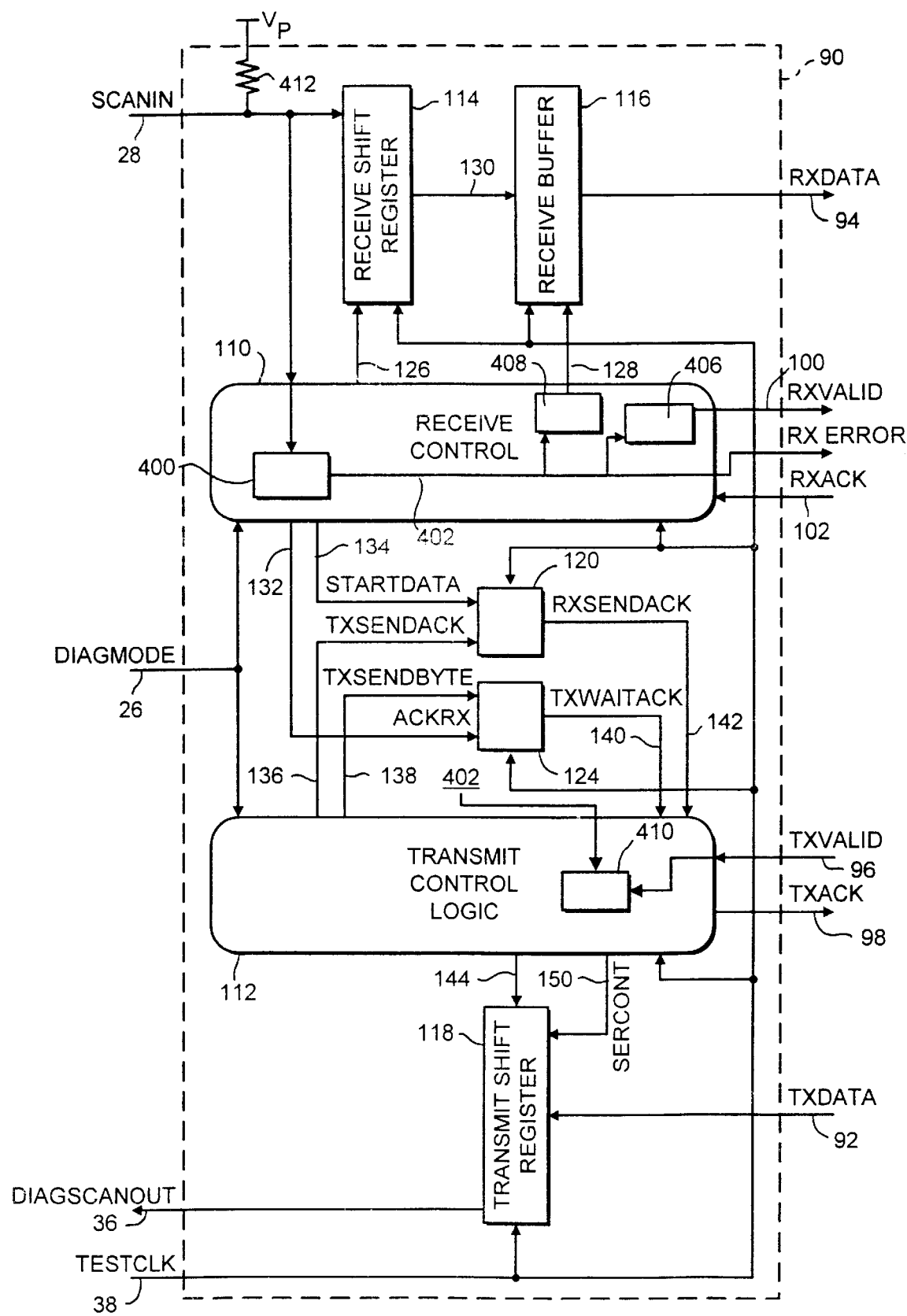
FIG. 3 illustrates a data adaptor according to the described embodiment for connection to the test access port controller of FIG. 2.

In the described embodiment, when provided with a diagnostic mode of operation in addition to a normal test mode, the integrated circuit 2 is preferably provided, as shown in FIG. 3, with a data adaptor 90 to interface between the TAP controller 4 and on-chip source/destination logic. The data adaptor 90 receives as inputs from the TAP controller 4 the scan data input signal SCANIN on line 28, the test clock signal TESTCLK on line 38 and the signal indicating selection of the diagnostic mode DIAGMODE on line 26. The data adaptor 90 outputs to the TAP controller 4 the signal DIAGSCANOUT on line 36. The data adaptor receives data from on-chip source/destination logic on a transmit data bus TXDATA on line 92, and outputs data to on-chip source/destination logic on a receive data bus RXDATA on line 94. The data adaptor 90 inputs a transmit valid signal TXVALID on line 96, and outputs a transmit acknowledge signal TXACK on line 98, both of which signals are control signals associated with the transmit data bus TXDATA. The data adaptor 90 outputs a receive valid signal RXVALID on line 100 and inputs a receive acknowledge signal RXACK on line 102, both of which signals are control signals associated with the receive data bus RXDATA.

The data adaptor 90 comprises a receive shift register 114, a receive buffer 116, receive control logic 110, a receive flow control status flip-flop 120, a transmit flow control status flip-flop 124, a transmit shift register 118, and transmit control logic 112. The receive shift register 114 receives the signal SCANIN on line 28 and a control signal from the receive control logic on line 126, and outputs data in parallel on bus 130 to form an input to the receive buffer 116. The receive buffer additionally receives a control signal from the receive control logic on line 128 and generates the receive data bus signal RXDATA on line 94. The receive control logic additionally generates the signal RXVALID on line 100, receives the signal RXACK on line 102, receives the signal DIAGMODE on line 26, and generates signals STARTDATA and ACKRX on lines 134 and 132 respectively. In accordance with the preferred embodiment of this invention, the receive control logic further includes an error detector 400 which receives the input serial stream SCANIN and detects when an error in communication arises in a manner to be described in more detail hereinafter. When an error condition has been detected, an error condition indicator signal is asserted on line 402 and this is asserted as an error signal RXERROR externally of the receive control block 110. The error indicator 402 is also supplied to a valid inhibitor 406 which inhibits generation of the RXVALID signal 100 in an error condition. The error indicator 402 is also supplied to a receive signal inhibitor 408 which inhibits the receive buffer from allowing any further incoming data 130 to be communicated on RXDATA 94.

The receive flow control status flip-flop 120 receives the signal STARTDATA and a signal TXSENDACK on line 136, and outputs a signal RXSENDACK to the transmit control logic on line 142. The transmit flow control status flip-flop 124 receives the signal ACKRX and a signal TXSENDBYTE on line 138, and outputs a signal TXWAIT-ACK to the transmit control logic on line 140. The transmit control logic 112 additionally receives the signal DIAGMODE on line 26 and the signal TXVALID on line 96, and outputs the signal TXACK on line 98, a control signal to the transmit shift register 118 on line 144, and a parallel signal SERCONT to the transmit shift register 118. The transmit control logic 112 also receives the error indicator 402 which is supplied to a transmit inhibitor 410 which inhibits further transmission of data off chip when an error condition is detected by inhibiting the TXVALID signal 96. This has the effect of causing the data TXDATA 92 to be ignored. The transmit shift register 118 additionally receives the parallel data bus TXDATA on lines 92, and outputs the signal DIAGSCANOUT on line 36.

The data adaptor may optionally be provided with an input from the well-known on-chip system clock, although this connection is not shown in any of the figures. The system clock may be used for synchronous implementations where the data and control signals between the data adaptor and the on-chip destination/source logic must be synchronous with the clock of the on-chip destination/source logic. The data adaptor 90 performs synchronization of serial data from the TAP controller clocked by the signal TESTCLK (derived from the signal TCK) to the clock environment of the internal functionality of the destination/source logic, and to the TAP controller clocked by the signal TESTCLK from the clock environment of the internal destination/source logic. The TAP controller 4 may optionally provide a scan enable signal to the data adaptor 90, which signal is also not shown in the figures. Such a scan enable signal indicates that the TAP controller has selected this scan path for data output onto the test data output signal TDO.

The data adaptor converts the uni-directional serial data from off-chip through the TAP controller 2 into a format more suited for use by the on-chip destination/source logic. Conversely the data adaptor must convert the data format supplied by the on-chip destination/source logic into unidirectional serial data. In a preferred embodiment, it is desired to provide data to the on-chip destination/source logic in the form of eight parallel bits, or a byte, of data. However, in the extreme, the receive data bus RXDATA and the transmit data bus TXBUS could be only one bit, rather than a byte, wide. It is also envisaged that the receive and transmit data buses RXBUS and TXBUS could be multiple byte wide buses.

The data adaptor 90 must perform the function of "flow control" of both receive and transmit data. Serial data may only be passed through the TAP controller 4 (in either direction) when the receiving end has capacity available to receive that data to prevent data loss or corruption. The communication of the fact that the receiving end is ready to receive more data is achieved by transmitting such information in the reverse direction. This constitutes the flow control protocol. The data adaptor 90 according to the described embodiment provides for the unidirectional serial data to be converted into parallel format for communication with the on-chip destination/source logic. Thus a flow control protocol is also necessary between the data adaptor 90 and the on-chip destination/source logic.

This flow control must thus be performed across two boundaries: the boundary between the TAP controller 4 and the data adaptor 90; and the boundary between the data adaptor 90 and the on-chip destination/source logic to which the data adaptor 90 interfaces.

Figure 4:
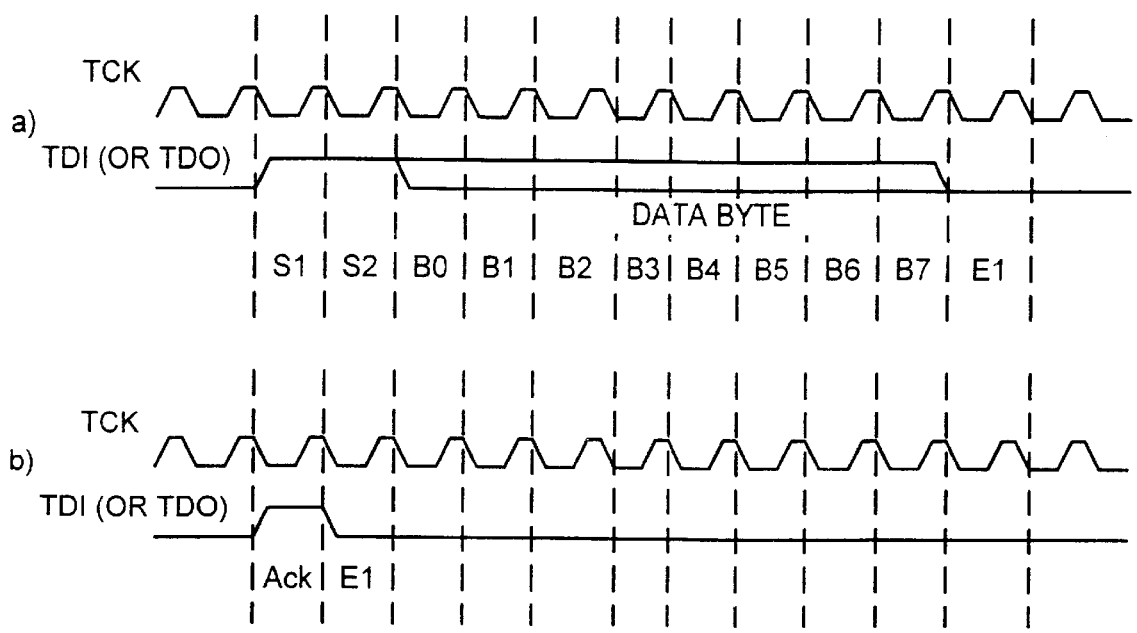
FIG. 4 illustrates the data format for data communicated off-chip via the test access port controller of FIG. 2 in a diagnostic mode.

To provide flow control between the TAP controller 4 and the data adaptor 90 the unidirectional data on the test data input signal TDI line and the test data output signal line are encoded with start and stop bits as shown in FIG. 4(a). The bit flow control protocol is return to zero (RTZ) signaling with two start bits S1 and S2, and a stop bit E1. In between the start bits and the stop bit is included a byte of data. Serial data in this format is passed from the test data input TDI of the TAP controller to the SCANIN signal on line 28 and input to the data adaptor 90. The receive control logic 110 of the data adaptor receives the serial data signal SCANIN. When the receive control signal recognizes two successive serial bits as being the start bits S1 and S2, the receive shift register 114 is controlled on the line 126 to serially load the next eight successive bits, which form a data byte, therein.

The error detector 400 operates by detecting the lack of a stop bit such as stop bit E1 in the incoming data stream. Once an error of this type has been detected, the error indicator 402 is asserted which, as described earlier, has the effect of inhibiting further data from being transmitted or received. In addition, the external error signal RXERROR can be used to generate a visual indication that an error condition has been detected. When in the error condition, a reset block continues to monitor the serial input stream for a logic zero for a suitable number, e.g., ten continuous clock periods. If this clean input is detected, then the error indicator 402 is deasserted and data transmission and reception is resumed.

In response to the two consecutive start bits S1 and S2, the receive control logic 110 also sets the signal STARTDATA on line 134, which sets the receive flow control status flip-flop 120. When set, the receive flow control status flip-flop 120 in turn sets the signal RXSENDACK on line 142, which signal causes the transmit control logic 112 to send an acknowledgement signal on the test data output signal TDO in the form shown in FIG. 4(b), which signal comprises only a start acknowledge bit ACK and a stop bit E1. These bits are loaded directly into the transmit shift register in parallel as the signal SERCONT on line 150 under the control of the signal on line 144, and output from the transmit shift register in serial fashion in the form of FIG. 4(b), as the signal DIAGSCANOUT. Once the acknowledgement signal has been sent, the transmit control logic 112 sets the signal TXSENDACK on line 136 to reset the receive flow control status flip-flop and thereby reset the signal RXSENDACK.

The signal SERCONT, in accordance with the flow control protocol used in this embodiment, is a 3 bit signal which enables the start bits S1,S2 and the stop bit E1 to be loaded directly into the transmit shift register 118. When a byte of data is presented by the on-chip destination logic, to be output through the TAP controller 4, is present on the transmit data bus TXDATA it is loaded in parallel under the control of the transmit control logic 112 into the transmit shift register 118, and the transmit control logic 112 directly loads the start bits S1,S2 and the stop bit E1 forming signal SERCONT into the appropriate bit positions in the transmit shift register prior to serially shifting a signal in the format shown in FIG. 4(a). When sending an acknowledgement signal the transmit control logic 118 directly loads a single start bit and a stop bit into the transmit shift register, and then serially shifts them out.

When the receive control logic 110 receives the stop bit E1 on the signal SCANIN, the data byte has been loaded into the receive shift register 114, and under the control of the receive control logic 110 the data byte is transferred on bus 130 from the receive shift register 114 to the receive buffer 116. When a data byte has been loaded into the receive buffer 116 it is output on the bus RXDATA under control of the receive logic 110, which also sets the signal RXVALID on line 100. The destination/source logic on-chip, responsive to the signal RXVALID, accepts the data byte on the RXBUS and indicates this acceptance by setting the signal RXACK on line 102. In response to the signal RXACK the receive control logic 110 resets the signal RXVALID, and if there is a further data byte in the receive shift register 114 transfers this to the receive buffer 116 before again setting the signal RXVALID.

The receive buffer 116 is provided in a preferred embodiment. This allows acknowledge tokens, which overlap the reception of data, to be transmitted as soon as the two start bits have been received, and this also supports efficient data transfer rates by allowing successive bytes to be transferred without any gap between each byte. Data buffering may also be provided on the transmit side.

The destination/source logic on-chip transfers data bytes in parallel to the data adaptor 90 on the TXDATA bus 92. When the destination/source logic on-chip has a byte of data to be transmitted, the signal TXVALID on line 96 is set. In response to the signal TXVALID being set, the transmit control logic controls the transmit shift register 118 via line 144 to load the data byte on the TXDATA bus in parallel. In addition, using lines 150 the transmit control logic loads the appropriate start bits S1 and S2 and the stop bit E1 into the transmit shift register 118. Then, again under the control of the signal 144, the data byte including two start bits and a stop bit is serially shifted out of the transmit shift register as signal DIAGSCANOUT, which is connected through the TAP controller to the signal TDO. When the data byte on the bus TXDATA is loaded into the shift register, the transmit control logic sets the signal TXACK on line 98 to acknowledge receipt of the data byte to the destination logic on-chip.

The destination logic on-chip can then transmit a further byte of data. Data buffering may be provided in association with the transmit shift register if desired.

When the transmit shift register 118 is controlled by the transmit control logic 112 to output serial data in the form shown in FIG. 4(a), the transmit control logic 112 also sets the signal TXSENDBYTE on line 138, which sets the transmit flow control status flip-flop 124. In response to this signal, the transmit flow control status flip-flop 124 sets the signal TXWAITACK on line 140. Whilst the TXWAITACK signal is set, the transmit control logic is waiting for an acknowledgement from the destination/source logic off-chip that the data byte set has been received. If the destination/source logic off-chip successfully receives the transmitted data byte than it sends on the test data input signal TDI an acknowledgement signal of the type shown in FIG. 4(b). Upon receipt of such an acknowledgement signal as the SCANIN signal on line 28, the receive control logic 110 will set the signal ACKRX on line 132, causing the transmit flow control status flip-flop 124, and consequently the signal TXWAITACK, to be reset. The transmit control logic 112 is then prepared to receive and transmit the next parallel data byte from the source/destination logic on-chip.

FIG. 5 illustrates in schematic form how the data adaptor 90 may be used to establish a connection between a host memory and a target memory. The integrated circuit 2B comprises the TAP controller 4 and the data adaptor 90 which communicate between each other, off-chip, and with circuitry on-chip using signals as described hereinabove. The same reference numerals are used in FIG. 5 to denote signals which correspond to those already described. As can be seen in FIG. 5 the integrated circuit 2B also comprises a memory bus adaptor 160, a target CPU 162, and an on-chip memory 164. The integrated circuit 2B is provided with a memory bus 166 which interfaces with the target CPU 162 and the on-chip memory 164. The memory bus 166 is also connected to off-chip memory 174. Off-chip the test access port signals 14,16,18,20,22 TCK,TMS,TDI,TDO and TRST* are connected to a TAP controller initializer 176, which itself receives a serial data input signal SERIN on line 178 from a further data adaptor 180 and outputs a serial data output signal SEROUT on line 179 to the further data adaptor 180. The further data adaptor 180 outputs signals EXTRXDATA, EXTRXVALID, and EXTTXACK on lines 190,188 and 186 respectively to a further memory bus adaptor 194, and receives signals EXTTXDATA, EXTTXVALID, and EXTRXACK on lines 184,182 and 192 respectively from the further memory bus adaptor 194. The memory bus adaptor 194 is connected to an external memory bus 198. A host CPU 200 is connected to the external memory bus 198 and a further off-chip memory 202 is connected to the external memory bus 198.

The TAP controller initializer 176 configures the TAP controller 4 for operation either in the test mode or the diagnostic mode. The memory bus adaptors 160 and 194 adapt the parallel data on the bus RXDATA to a message format more suitable for communication with the on-chip destination/source logic. The memory bus adaptors are therefore message converters, and may be message converters of the type described in GB Application No. 9622685.7, hereby incorporated by reference. The memory bus adaptors must also convert the message format of the on-chip destination/source logic into parallel data bytes for transmission of the bus TXDATA.

In FIG. 5, the TAP controller initializer 176, data adaptor 180 and memory bus adaptor 194 can be considered to constitute an interface I between the integrated circuit 2B and the off chip CPU 200. In the interface I, signals 450 and 452 mirror the signals 26 and 38 between the on-chip TAP controller and data adaptor. The test access port signals 14, 16, 18, 20 and 22 are conveyed via a cable C between the integrated circuit and the interface I. In the event that the cable C becomes disconnected, the error signal will be asserted because then there will no longer be correct transmission of serial data according to the predetermined protocol from the integrated circuit 2B. The data adaptor will thus prevent further transmission of data from that integrated circuit 2B until the connection has been re-established and proper data communication has been resumed and detected. In order to further assist in the detection of disconnection the input signal 28 SCANIN has a pull-up resistor 412 (FIG. 3). If the connection is broken, then the signal goes high, that is to a logical one, and the error condition is detected. When the connection is re-established, the signal is driven low, that is a logical zero, from the other end of the cable and a clean condition is detected. The pull-up resistor 412 can as a matter of practicality be located on line 18 near the connection port to the cable C.

The structure of FIG. 5 can be used to implement various diagnostic procedures. The serial links on and off chip can allow the communication of various different types of diagnostic data between the integrated circuit 2 and the host CPU 200.

The host CPU can access the on-chip memory 164 or the off-chip memory 174 using the on-chip bus system 166 but without involving the target CPU 162. To do this, a memory access request made by the host CPU can be transmitted via the interfacing circuitry comprising the off-chip memory bus adaptor 194, data adaptor 180 and TAP controller initializer 176 and the on-chip TAP controller 4, data adaptor 90 and memory bus adaptor 160, undergoing the various conversions discussed herein. Similarly, data read from the on-chip memory 164 or off-chip memory 174 can be returned via the on-chip bus system 166 and the interface circuitry to the host CPU. Conversely, the target CPU may access the off-chip memory 202 associated with the host CPU. Data read from the off-chip memory 202 associated with the host CPU 200 can likewise be returned via the interface circuitry.

In addition, the target CPU can be monitored for diagnostic purposes. For example, its accesses to its own memory can be monitored by on-chip circuitry and information about the memory addresses which have been accessed can be transmitted to the host CPU using the interface circuitry. Moreover, the target CPU contains or has access to configuration registers which represent its status. Information about the content of these registers can be transmitted off-chip to the host CPU using the interface circuitry. Conversely, particular status information can be loaded into these registers to affect that state of the target CPU under the instruction of the host CPU.

Thus, the interface circuitry discussed herein allows the communication of diagnostic data including memory access requests from host to target and target to host (reads and writes); status information of CPU registers; data read from host memory or target memory in response to a memory access request; status data for loading into CPU registers; and information about memory addresses being accessed by the target CPU.

Thus, the interface circuitry allows the following diagnostic features, for example, to be provided in the circuit:

the facility to implement real time diagnostic procedures, that is while the target CPU is operating in real time and without intruding on its operation while the diagnostic procedures are taking place. In particular, monitoring of the memory bus and accesses to the target memory can be undertaken by the host CPU without involving the target CPU;

access to target memory and configuration registers from host;

access to host memory from target;

control of target CPU and sub-systems, including the facility to effect booting operations of the CPU from the host processor.

FIG. 6 illustrates in diagrammatic form another communication system. Reference numeral 2B denotes an integrated circuit of the type illustrated in FIG. 5. A connection port 414 provides for connection of test access port signals to the cable C. The remote end of the cable C is connected to an interface I'. The interface I' is similar to the interface I except that in addition to the circuitry illustrated in block I in FIG. 5, it includes a further data converter 416 which converts data into a format suitable for transmission via an Ethernet connection 418 to a network 420. In FIG. 6, the power supply for the network 420, Ethernet connection 418 and interface I' is independent of the power supply P for the integrated circuit 2. Thus, it is quite possible for the power supply P to become disconnected while the Ethernet connection and network remain active. In this situation, the error signal is asserted.

What is claimed is:

1. An integrated circuit comprising:
   a connection port having a serial data input pin and a serial data output pin;
   on-chip functional circuitry and test logic;
   a test access port controller connected to effect communication of serial data across the chip boundary via said input and output pins, the test access port controller being connectable to the test logic in a first mode of operation to effect communication of serial test data under control of an incoming clock signal and being operable in a second mode of operation to communicate data as a sequence of serial bits according to a predetermined protocol between the connection port and the on-chip functional circuitry;
   wherein the integrated circuit includes error detection means for detecting an error condition in the protocol and gating circuitry responsive to detection of the error condition to prevent communication of subsequent data until the error condition is detected as having been removed.

2. The integrated circuit according to claim 1, further comprising:
   a data adaptor which is connectable to the input and output pins via the test access port controller in the second mode of operation;
   wherein in the second mode the data adaptor is supplied with parallel data and control signals from said on-chip functional circuitry and converts said parallel data and control signals into said sequence of serial bits including flow control bits and data bits for communicating off chip via the test access port controller under the control of said incoming clock signal, said data adaptor receiving from off chip via the serial data input pin a sequence of serial bits including flow control bits and data bits for conversion into parallel data and control signals for said on-chip functional circuitry.

3. The integrated circuit according to claim 1, wherein according to said predetermined protocol a stop bit is transmitted after each predetermined number of serial data bits, the error condition being detected by detecting lack of said stop bit.

4. The integrated circuit according to claim 1, wherein on detection of the error condition, an error signal is asserted by the error detection means.

5. The integrated circuit according to claim 4, wherein the error signal generates a visible indication to a user that an error condition has been detected.

6. The integrated circuit according to claim 1, wherein the test access port controller further comprises circuitry for detection of removal of the error condition.

7. The integrated circuit according to claim 1, wherein the connection port includes a pull-up resistor which generates a logical value having a predetermined state indicating an error condition when a physical connection is broken at the connection port.

8. A communications system comprising:
   an integrated circuit comprising:
      a connection port having a serial data input pin and a serial data output pin;
      on-chip functional circuitry and test logic;
      a test access port controller connected to effect communication of serial data across the chip boundary via said input and output pins, the test access port controller being connectable to the test logic in a first mode of operation to effect communication of serial test data under control of an incoming clock signal and being operable in a second mode of operation to communication data as a sequence of serial bits according to a predetermined protocol between the connection port and the on-chip functional circuitry;
      wherein the integrated circuit includes error detection means for detecting an error condition in the protocol and gating circuitry responsive to detection of the error condition to prevent communication of subsequent data until the error condition is detected as having been removed, wherein the connection port is connected to a cable in the normal state; and
   an interface device having an interface port connected to a remote end of the cable and operable to receive and transmit data between the interface and the integrated circuit according to said predetermined protocol, said interface being operable to convert said data into a format suitable for communication to a network via an Ethernet connection.

9. A device to detect errors in a computer system comprising:
   a first chip having functional circuitry and test logic;
   a connection port having a serial data input pin and a serial data output pin, and coupled to the first chip;
   a second chip including a test access port controller coupled to the connection port, the test access port controller structured to be coupled to the test logic in a first mode of operation for directing serial test data controlled by a clock signal, and structured to be coupled to the functional circuitry in a second mode of operation to direct serial data between the test access port controller and the first chip according to a communication protocol; and
   an error detecting circuit on the second chip and coupled to the test access port controller, the error detecting circuit structured to detect an error condition in the protocol used for transmitting data between the first and the second chop and structured to prevent communication between the test access port controller and the first chip until the detected error is corrected.

10. The device of claim 9 wherein the communication protocol dictates a stop bit is to be received after a predetermined number of data bits, and wherein the error detecting circuit detects an error when an expected stop bit is missing from the data.

11. The device of claim 10 further comprising:

circuitry coupled to the test access port controller and structured to, after the error detecting circuit detects an error, detect the completion of the error condition.

12. The device of claim 11 wherein the error signal is a visible signal.

13. The device of claim 9 further comprising:

a pull-up resistor coupled between a first voltage and the connection port, the pull-up resistor structured to cause a signal when a physical connection is broken at the connection port.

14. The device of claim 9 further comprising:

a data adapter coupled to the connection port during the second mode of operation and structured to be supplied parallel data and control signals from the functional circuitry and convert the parallel data and control signals into serial data having flow control bits and data bits, the serial data communicated to the test access port controller under control of the clock signal, wherein the data adapter is also structured to accept a second set of serial data by way of the serial data input and convert the second set of serial data into a second set of parallel data and control signals communicated to the functional circuitry.

15. In a computer error detection system, a method to detect errors in a computer system comprising:

in a first mode of operation, sending serial test data controlled by a clock signal from a test access port controller on a first chip to functional circuitry located on a second chip;

in a second mode of operation, sending data in compliance with a communication protocol from the test access port controller on the first chip to testing logic on the second chip; and detecting errors in data transmitted from the first chip to the second chip, or transmitted from the second chip to the first chip and sending an error signal when data is received that is not in accordance with the communication protocol.

16. The computer error detection system of claim 15 wherein detecting errors occurs in an error detecting circuit located on the second chip.

17. The computer error detection system of claim 16 wherein the error is signaled when an expected stop bit is missing from the received data.

18. The computer error detection system of claim 15 further including:

converting the data in compliance with a communication protocol into parallel data and control signals prior to providing it to the functional circuitry.

* * * * *